United States Patent
Liu et al.

(10) Patent No.: US 10,699,898 B2
(45) Date of Patent: Jun. 30, 2020

(54) METHOD FOR OXIDIZING A SILICON CARBIDE BASED ON MICROWAVE PLASMA AT AN AC VOLTAGE

(71) Applicant: INSTITUTE OF MICROELECTRONICS, CHINESE ACADEMY OF SCIENCES, Beijing (CN)

(72) Inventors: Xinyu Liu, Beijing (CN); Shengkai Wang, Beijing (CN); Yun Bai, Beijing (CN); Yidan Tang, Beijing (CN); Zhonglin Han, Beijing (CN); Xiaoli Tian, Beijing (CN); Hong Chen, Beijing (CN); Chengyue Yang, Beijing (CN)

(73) Assignee: INSTITUTE OF MICROELECTRONIICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 16/287,902

(22) Filed: Feb. 27, 2019

(65) Prior Publication Data
US 2020/0152451 A1 May 14, 2020

(30) Foreign Application Priority Data
Nov. 13, 2018 (CN) .......................... 2018 1 1349424

(51) Int. Cl.
*H01L 21/02* (2006.01)
*H01J 37/32* (2006.01)
(52) U.S. Cl.
CPC .. *H01L 21/02236* (2013.01); *H01J 37/32201* (2013.01); *H01J 37/32449* (2013.01); *H01L 21/02164* (2013.01)

(58) Field of Classification Search
None
See application file for complete search history.

(56) References Cited

U.S. PATENT DOCUMENTS

| | | | | | |
|---|---|---|---|---|---|
| 5,271,800 | A | * | 12/1993 | Koontz | ............. H01L 21/31138 250/251 |
| 5,633,502 | A | * | 5/1997 | Fischione | ................ G01N 1/32 250/440.11 |

(Continued)

FOREIGN PATENT DOCUMENTS

| CN | 1148104 A | 4/1997 |
|---|---|---|
| CN | 1491527 A | 4/2004 |

(Continued)

*Primary Examiner* — Bradley Smith
(74) *Attorney, Agent, or Firm* — Christensen, Fonder, Dardi & Herbert PLLC

(57) ABSTRACT

A method for oxidizing a silicon carbide based on microwave plasma at an AC voltage, including: step one, providing a silicon carbide substrate, and placing the silicon carbide substrate in a microwave plasma generating device; step two, introducing oxygen-containing gas to generate oxygen plasma at an AC voltage; step three, controlling movements of oxygen ions and electrons in the oxygen plasma by the AC voltage to generate an oxide layer having a predetermined thickness on the silicon carbide substrate, wherein when a voltage of the silicon carbide substrate is negative, the oxygen ions move close to an interface and perform an oxidation reaction with the silicon carbide, and when the voltage of the silicon carbide substrate is positive, the electrons move close to the interface and perform a reduction reaction with the silicon carbide, removing carbon residue; step four, stopping the introduction of oxygen-containing gas and the reaction completely.

8 Claims, 2 Drawing Sheets

(56) References Cited

U.S. PATENT DOCUMENTS

| | | | | |
|---|---|---|---|---|
| 2002/0092541 | A1* | 7/2002 | Yokogawa | B08B 1/00 |
| | | | | 134/1.2 |
| 2018/0145137 | A1* | 5/2018 | Yamamoto | H01L 21/0465 |
| 2018/0226260 | A1* | 8/2018 | Romm | H01L 21/3081 |

FOREIGN PATENT DOCUMENTS

| | | |
|---|---|---|
| CN | 101151721 A | 3/2008 |
| CN | 108584963 A | 9/2018 |

\* cited by examiner

METHOD FOR OXIDIZING A SILICON CARBIDE BASED ON MICROWAVE PLASMA AT AN AC VOLTAGE

CROSS-REFERENCE TO RELATED APPLICATION(S)

This application claims priority to the Chinese Patent Application No. 201811349424, filed on Nov. 13, 2018, which is incorporated herein by reference in its entirety.

TECHNICAL FIELD

The application refers to the technical field of semiconductors, and in particular to a method for oxidizing a silicon carbide based on microwave plasma at an AC voltage.

BACKGROUND

Silicon carbide (SiC) is a third-generation semiconductor material. With its excellent physical properties such as large forbidden band width, high breakdown electric field, high electron mobility and high thermal conductivity, it is particularly suitable for the preparation of power electronic devices. SiC MOSFETs are the most concerned power electronic devices. Compared with Si MOSFETs, SiC MOSFETs which have low conduction loss, fast switching rate and high temperature tolerance are especially suitable for power switching applications. How to reduce the defects at the gate oxide of the SiC MOSFETs is still the focus of current research.

Since SiC is a compound semiconductor capable of thermally growing $SiO_2$, it is possible to prepare a device structure similar to Si MOS. However, the thermo-oxidation of SiC requires a higher temperature than Si, for example, up to 1300 ° C. Currently, the thermo-oxidation of SiC mainly employs an electric resistance heating furnace in which oxygen molecules reacts with SiC at a high temperature to generate $SiO_2$. The reaction process is performed in thermal equilibrium conditions, resulting in degradation of interface quality such as interface carbon cluster residue, formation of defects such as Si-O-C bonding, dangling bonding of C, oxygen vacancies etc., as shown in FIG. 1. The presence of carbon clusters may form defect centers at the interface, reducing the carrier mobility and the output performance of SiC MOSFETs. In addition, high temperature oxidation may also cause interface damage and reduce oxidation efficiency.

Therefore, an efficient gate oxidation process with low interface state is the key to ensure the reliable operation of SiC MOSFETs. In recent years, a method of oxidizing SiC by plasma at a low temperature has been proposed to improve the interface quality. However, the method has low oxidation efficiency, and requires more oxidation time to obtain a thick gate oxide. In addition, in the oxidation process, SiC and $SiO_2$ are still in a thermodynamic equilibrium state at the interface between SiC and $SiO_2$, resulting in an unsatisfactory interface quality.

SUMMARY

In order to solve the problems in the prior art, the present invention provides a method for oxidizing a silicon carbide based on microwave plasma at an AC voltage, which may restore the interface in real time during the oxidation process, reduce the carbon residue and the interface defect density, and improve the performance of semiconductor structures.

In order to achieve the above object, the following technical solutions are provided in the present invention.

A method for oxidizing a silicon carbide based on microwave plasma at an AC voltage, including:

step one, providing a silicon carbide substrate, and placing the silicon carbide substrate in a microwave plasma generating device;

step two, introducing oxygen-containing gas to generate oxygen plasma at an AC voltage;

step three, controlling movements of oxygen ions and electrons in the oxygen plasma by the AC voltage to generate an oxide layer having a predetermined thickness on the silicon carbide substrate, wherein when a voltage of the silicon carbide substrate is negative, the oxygen ions move close to an interface and perform an oxidation reaction with the silicon carbide, and when the voltage of the silicon carbide substrate is positive, the electrons move close to the interface and perform a reduction reaction with the silicon carbide, removing carbon residue;

step four, stopping the introduction of the oxygen-containing gas, completing the reaction.

Preferably, the AC voltage comprises a square wave voltage having a period of 10-30 s and a voltage amplitude of 5-10 V.

Preferably, a reaction temperature of the oxygen plasma and the silicon carbide is 500 to 900° C., and a reaction pressure thereof is 400 to 1000 mTorr.

Preferably, the oxygen plasma is heated to a reaction temperature at a rate of 0.5 to 2° C./s.

Preferably, the microwave plasma generating device has an input power of 800 to 2000 W and a microwave frequency of 2.4 to 2.5 GHz.

Preferably, a total discharge time for the plasma is 400 to 1000 s.

Preferably, the oxygen-containing gas comprises pure oxygen, or a mixture of oxygen gas and inert gas where oxygen content in the mixture is preferably 30 to 90 vol.%.

Preferably, the resulted silicon dioxide has a thickness of 1 to 60 nm.

Preferably, upon completion of the reaction, nitrogen gas is introduced for cooling in the nitrogen atmosphere.

Compared with the prior art, the present invention has the following beneficial effects.

In the oxidization condition of the invention, the oxygen ions and the electrons move close to the interface respectively, so that the oxidation and reduction reactions at the interface are performed alternately. In this case, during the oxidation process, the interface can be restored in real time, reducing carbon residue and improving interface quality, as well as reducing surface scattering and improving device performance.

DETAILED DESCRIPTION

In order to make the objects, technical solutions and advantages of the present invention more apparent, the present invention will be further described in detail below in conjunction with the specific embodiments with reference to the accompanying drawings.

Figure 1:
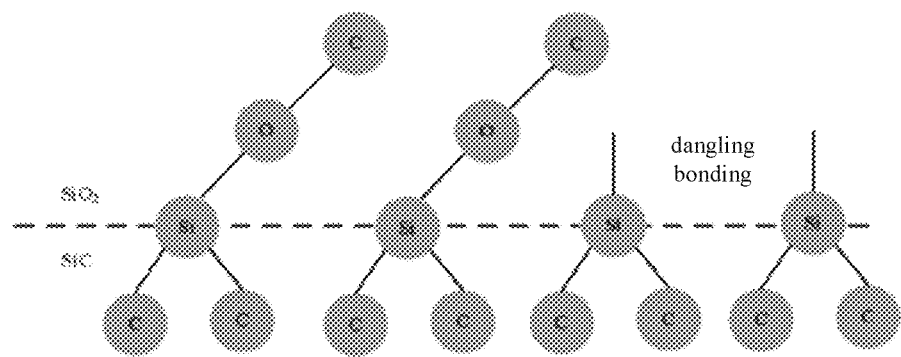
FIG. 1 is a schematic diagram of SiC/$SiO_2$ interface defects.
Figure 2A:
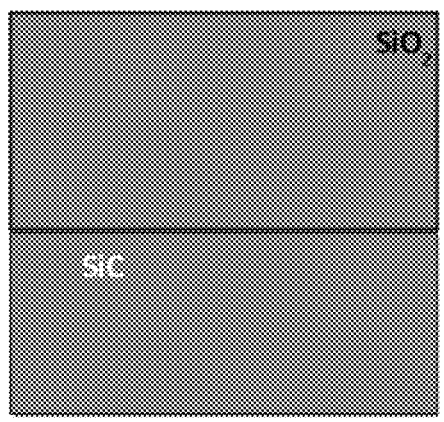
FIG. 2A is an interface of a thermodynamic non-equilibrium state in ideal conditions.
Figure 2B:
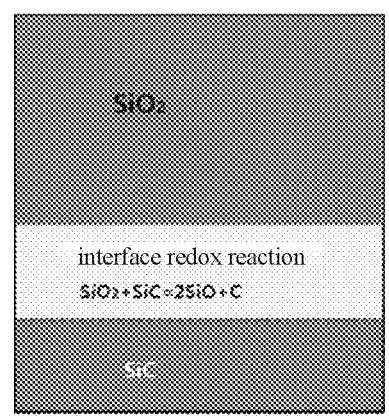
FIG. 2B is an interface of a thermodynamic equilibrium state in conventional oxidation conditions.

In a SiC oxidation process, the ideal situation is to obtain a perfect SiC/SiO$_2$ interface in thermodynamic non-equilibrium conditions, as shown in FIG. 2A. However, in conventional oxidation conditions, the reaction of oxygen molecules with SiC is performed in thermodynamic equilibrium conditions, resulting in an unsatisfactory actual interface as shown in FIG. 2B. There is a transition layer in the SiC/SiO$_2$ interface, where carbon clusters are present, causing gate oxide leakage or breakdown during operation of devices such as MOSFETs. In addition, the transition layer may also form scattering centers, which scatter carriers at the channel of the MOSFET, reducing carrier mobility and output current, and affecting device performance.

It is found that the SiC gate oxidation process may be regarded as a carbon reaction diffusion process. With low temperature plasma oxidation, the reaction diffusion time of carbon is equivalent to the chemical reaction time of the plasma due to the long duration of the reaction process. In this case, there is still a gradient distribution of carbon somewhere at the SiC/SiO$_2$ interface.

To this end, the present invention provides a novel a method for oxidizing a silicon carbide based on microwave plasma at an AC voltage. Oxidation efficiency is improved by optimizing the conditions of plasma oxidation. Carbon residue at the interface is effectively reduced, the interface is restored from damage, and the interface quality is improved.

Figure 3:
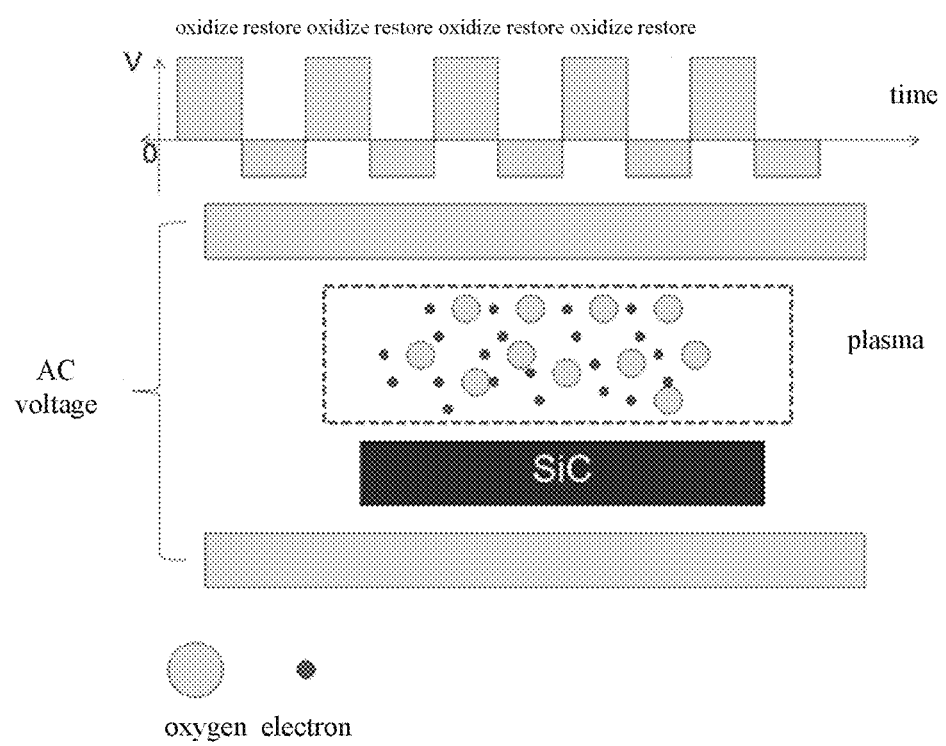
FIG. 3 is a schematic diagram showing application of voltage to the plasma according to an embodiment of the present invention.

As shown in FIG. 3, the present invention mainly ionizes molecular oxygen in a specific temperature and pressure range such that the molecular oxygen forms oxygen plasma or oxygen radical that is split uniformly, and the movements of the plasma are controlled by using alternating current to control the oxidation process. In particular, when the silicon carbide substrate is at a negative voltage, the oxygen ions move close to the SiC interface under the electric field, and perform an oxidation reaction with SiC. When a thin oxide layer having a certain thickness is formed, the oxidation ends. At this time, the pulse direction of the applied bias voltage is changed, and electrons move close to the SiC interface under the electric field, and a reduction reaction occurs at the interface to remove the formed carbon. By alternately performing the above processes, the number of defects at the interface can be effectively reduced, thereby reducing the carbon residue, reducing the scattering effect of the defect centers on the carriers in the oxide layer, increasing the mobility and thus increasing the driving current of the device.

By controlling the period of the pulse current, it is possible to control the oxidation and reduction reaction time, thereby controlling the oxidation process and the restoration process. In one embodiment of the invention, the AC voltage includes a square wave voltage with a period of 10-30 s and a voltage amplitude of 5 V.

In an embodiment of the invention, the oxygen-containing gas is pure oxygen, or a mixture of oxygen and inert gas where the oxygen content in the mixture is 30-90 vol.%.

The thickness of the oxide layer in the present invention may be flexibly adjusted. In some embodiments of the invention, the thickness of the resulted silicon dioxide may be 1 to 60 nm.

In an embodiment of the present invention, the reaction temperature of the oxygen plasma and the silicon carbide is 500 to 900° C., where the plasma is heated to the reaction temperature at a rate of 0.5 to 2° C./s, and the reaction pressure is 400 to 1000 mTorr.

In an embodiment of the invention, the microwave plasma generating device has an input power of 800-2000 W and a microwave frequency of 2.4-2.5 GHz. The plasma discharge time may be 400-1000 s.

In some embodiments of the invention, once the reaction is completed, nitrogen is introduced for cooling in the nitrogen atmosphere.

Example 1

The microwave input power of the microwave plasma generating device is set to 1000 W, and the microwave frequency for activating microwave plasma is adjustable from 2.4 to 2.5 GHz. In the condition of 800 mTorr pressure and pure oxygen, the initial temperature of the sample stage is set to 100 ° C., and the plasma is heated at a rate of 1.5 ° C./s until the temperature reaches a preset microwave plasma oxidation temperature of 800 ° C. Meanwhile, a square wave voltage having a voltage period of 20 s and a voltage amplitude of 5V is applied to the oxygen plasma, and the plasma discharge time is 700 s. Thus, plasma oxidation is performed and the thickness of the oxide layer is about 40 nm. Once the oxidation is completed, the pure oxygen is replaced with pure nitrogen for cooling in a nitrogen atmosphere.

Compared with the conventional high temperature oxidation method or low temperature plasma oxidation method, the oxidation reaction efficiency of the present invention may be increased by 20%-50%, the C-related defects may be reduced by more than 20%, and the formation rate of the SiC surface corrosion pit may be reduced to less than 10%.

Objects, solutions and advantages of the invention have been described in detail in the specific embodiments described above. It is appreciated that the detailed description above is only for describing the embodiments of the invention rather than limiting the invention, and that the all modifications, equivalents, improvements, etc. are made within the spirit and scope of the invention are intended to be included within the scope of the invention.

What is claimed is:

1. A method for oxidizing a silicon carbide based on microwave plasma at an AC voltage, including:
   step one, providing a silicon carbide substrate, and placing the silicon carbide substrate in a microwave plasma generating device;
   step two, introducing oxygen-containing gas to generate oxygen plasma at an AC voltage;
   step three, controlling movements of oxygen ions and electrons in the oxygen plasma by the AC voltage to generate an oxide layer having a predetermined thickness on the silicon carbide substrate, wherein when a voltage of the silicon carbide substrate is negative, the oxygen ions move close to an interface and perform an oxidation reaction with the silicon carbide, and when the voltage of the silicon carbide substrate is positive, the electrons move close to the interface and perform a reduction reaction with the silicon carbide, removing carbon residue;
   step four, stopping the introduction of the oxygen-containing gas, completing the reaction;
   wherein the AC voltage comprises a square wave voltage having a period of 10-30 s and a voltage amplitude of 5-10 V.

2. The method according to claim 1, wherein a reaction temperature of the oxygen plasma and the silicon carbide is 500 to 900 ° C., and a reaction pressure thereof is 400 to 1000 mTorr.

3. The method according to claim 1, wherein the oxygen plasma is heated to a reaction temperature at a rate of 0.5 to 2 ° C./s.

4. The method according to claim 1, wherein the microwave plasma generating device has an input power of 800 to 2000 W and a microwave frequency of 2.4 to 2.5 GHz.

5. The method according to claim 1, wherein a total discharge time for the plasma is 400 to 1000 s.

6. The method according to claim 1, wherein the oxygen-containing gas comprises pure oxygen, or a mixture of oxygen gas and inert gas where oxygen content in the mixture is preferably 30 to 90 vol.%.

7. The method according to claim 1, wherein the resulted silicon dioxide has a thickness of 1 to 60 nm.

8. The method according to claim 1, wherein upon completion of the reaction, nitrogen gas is introduced for cooling in the nitrogen atmosphere.

* * * * *